United States Patent [19]

Maeno

[11] Patent Number: 4,969,126
[45] Date of Patent: Nov. 6, 1990

[54] SEMICONDUCTOR MEMORY DEVICE HAVING SERIAL ADDRESSING AND OPERATING METHOD THEREOF

[75] Inventor: Hideshi Maeno, Hyogo, Japan

[73] Assignee: Mitsubishi Denki Kabushiki Kaisha, Tokyo, Japan

[21] Appl. No.: 296,021

[22] Filed: Jan. 12, 1989

[30] Foreign Application Priority Data

Apr. 14, 1988 [JP] Japan .................................. 63-6145

[51] Int. Cl.[5] .............................................. G11C 8/00
[52] U.S. Cl. .................................. 365/240; 365/189.12
[58] Field of Search ..................... 365/189.12, 219, 220, 365/230.09, 239, 240, 78

[56] References Cited

PUBLICATIONS

S. Funatsu et al., "Designing Digital Circuits with Easily Testable Consideration", 1978 Semiconductor Test Conference, Digest of Papers, pp. 89–102.
G. Hoffman de Visme, "Binary Sequences", 1971.

Primary Examiner—Joseph A. Popek
Attorney, Agent, or Firm—Lowe, Price, LeBlanc, Becker & Shur

[57] ABSTRACT

An IC card comprises an integrated circuit having a memory circuit and a shift register formed thereon in a package. The memory circuit is selectively disabled by an external signal. The memory circuit comprises a plurality of data terminals for inputting and outputting data, one of which connected to a serial input terminal of the shift register. Address information is serially applied bit by bit from outside to the data terminal when the memory circuit is in the disabled state. The address information is converted into parallel address signals by the shift register to be applied to the address terminals of the memory circuit, so that the number of the external terminals can be reduced. A binary digit string in accordance with an exhaustive random sequence is used as the address information applied in series, thereby increasing the speed of the data transfer.

27 Claims, 11 Drawing Sheets

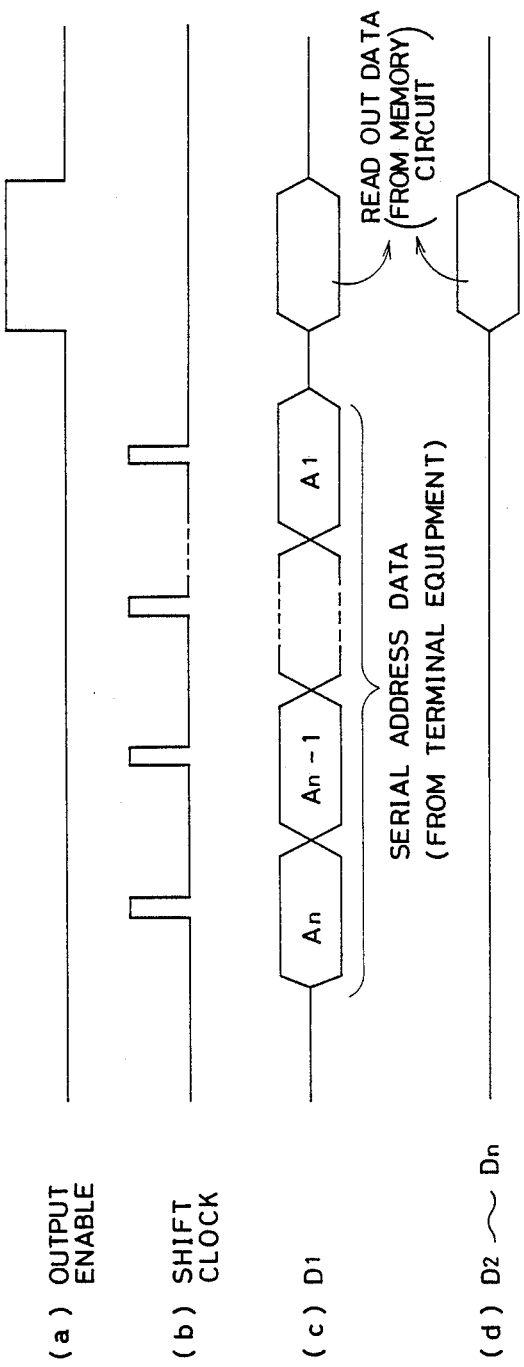

FIG. 8

| EXAMPLE OF EXHAUSTIVE RANDOM SEQUENCES (REPRESENTED BY BINARY DIGIT STRING) | DECIMAL REPRESENTATION |
|---|---|
| 0 0 0 1 0 0 1 1 0 1 0 1 1 1 1 \|0 0 0 0\| | 0 |
| 0 0 0 1 0 0 1 1 0 1 0 1 1 1 \|1 0 0 0\| 0 | 8 |
| 0 0 0 1 0 0 1 1 0 1 0 1 1 \|1 1 0 0\| 0 0 | 12 |
| 0 0 0 1 0 0 1 1 0 1 0 1 \|1 1 1 0\| 0 0 0 | 14 |
| 0 0 0 1 0 0 1 1 0 1 0 \|1 1 1 1\| 0 0 0 0 | 15 |
| 0 0 0 1 0 0 1 1 0 1 \|0 1 1 1\| 1 0 0 0 0 | 7 |
| 0 0 0 1 0 0 1 1 0 \|1 0 1 1\| 1 1 0 0 0 0 | 11 |
| 0 0 0 1 0 0 1 1 \|0 1 0 1\| 1 1 1 0 0 0 0 | 5 |
| 0 0 0 1 0 0 1 \|1 0 1 0\| 1 1 1 0 0 0 0 | 10 |
| 0 0 0 1 0 0 \|1 1 0 1\| 0 1 1 1 0 0 0 0 | 13 |
| 0 0 0 1 0 \|0 1 1 0\| 1 0 1 1 1 0 0 0 0 | 6 |
| 0 0 0 1 \|0 0 1 1\| 0 1 0 1 1 1 0 0 0 0 | 3 |
| 0 0 0 \|1 0 0 1\| 1 0 1 0 1 1 1 0 0 0 0 | 9 |
| 0 0 \|0 1 0 0\| 1 1 0 1 0 1 1 1 0 0 0 0 | 4 |
| 0 \|0 0 1 0\| 0 1 1 0 1 0 1 1 1 0 0 0 0 | 2 |
| \|0 0 0 1\| 0 0 1 1 0 1 0 1 1 1 0 0 0 0 | 1 |

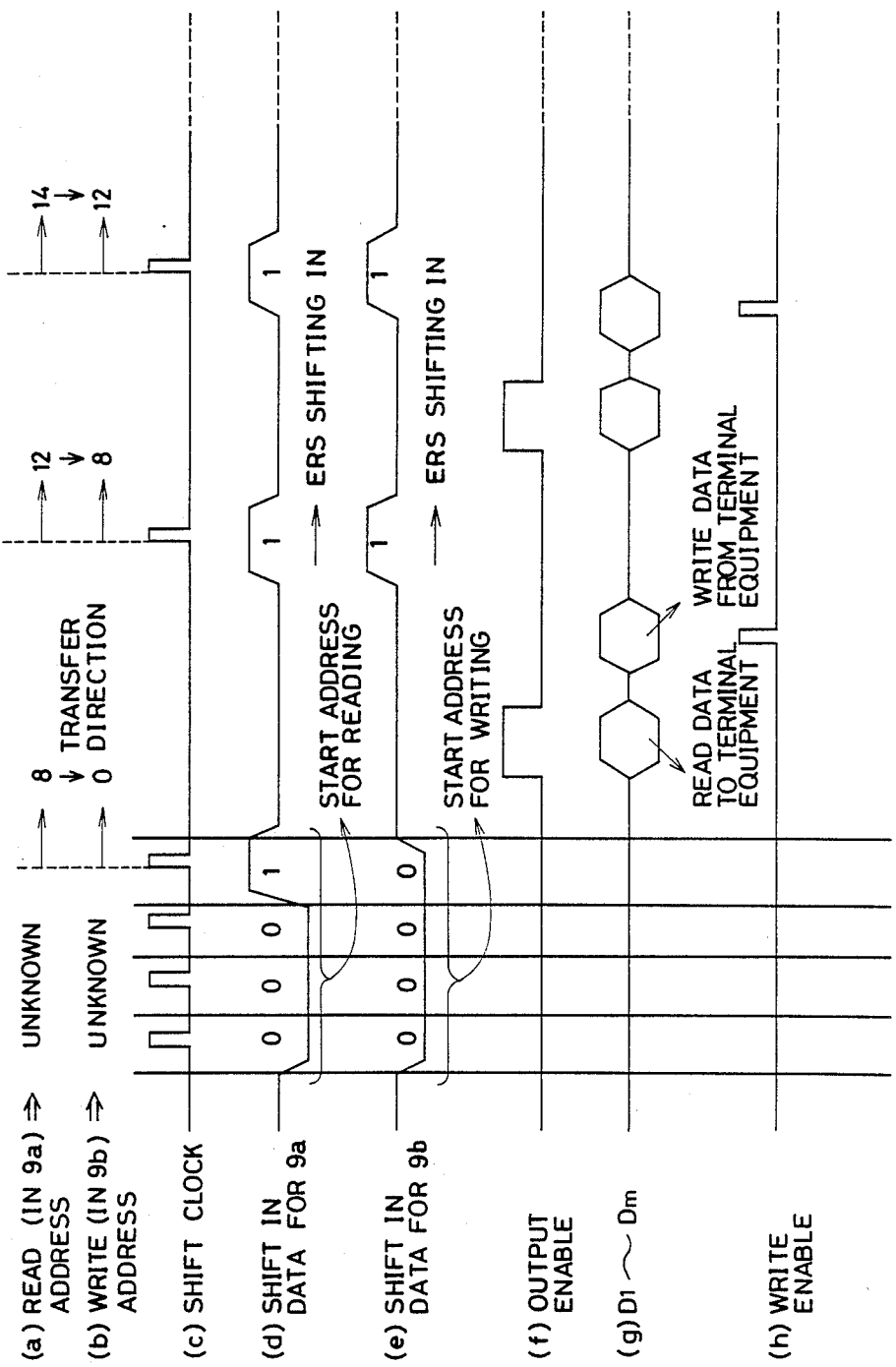

SEMICONDUCTOR MEMORY DEVICE HAVING SERIAL ADDRESSING AND OPERATING METHOD THEREOF

BACKGROUND OF THE INVENTION

1. Field of the Invention

The present invention generally relates to semiconductor memory devices, and more specifically, to semiconductor memory devices comprising memory chips mounted on printed circuit boards and operating method thereof.

2. Description of the Prior Art

Recently, IC (Integrated Circuit) cards have been remarkably developed. One type of such IC cards is a memory card comprising a memory (not containing a CPU) such as a static RAM, a programmable ROM, and so on.

In general, a memory used in such a memory card is adapted to be accessed only sequentially but not randomly. On the other hand, in a conventional magnetic disc memory, for example, any one of sectors formed in the disc is selected by random accessing while data can be accessed only sequentially within the selected sector. Therefore, the above described memory card can be adapted to the same use as that of the conventional magnetic disc memory.

FIG. 1 is a block diagram schematically showing the structure of such conventional IC card (memory card). Referring to FIG. 1, an integrated circuit 1 having a memory circuit 2 formed of a known SRAM, PROM, EPROM or a mask ROM mounted thereon is provided in a package 100 of the IC card. The integrated circuit 1 has n address terminals 3 connected to the memory circuit 2 for receiving n bits of address signals $A_1, A_2, \ldots, A_n$ and m data terminals 4 connected to the memory circuit 2 for inputting/outputting m bits of data $D_1, D_2, \ldots, D_m$. Further, n external address terminals 5 and m external data terminals 6 are provided in the package 100, with the address terminals 3 of the integrated circuit 1 respectively connected to the corresponding external address terminals 5 by printed wires and the data terminals 4 respectively connected to the corresponding external data terminals 6 by printed wires. These external address terminals 5 and the external data terminals 6 are provided for communication with an interface circuit (not shown) on the side of the terminal equipment, when the IC card is inserted in the terminal equipment (not shown) More specifically, when these external terminals 5 and 6 are coupled to the interface circuit of the terminal equipment, n bits address signals $A_1, A_2, \ldots, A_n$ applied from the interface circuit to the external address terminal 5 are further applied to the memory circuit 2 through the address terminals 3 of the integrated circuit 1, thereby accessing any one of the memory cells (not shown) constituting the memory circuit 2. The exchange of data between the selected memory cell and the interface circuit of the terminal equipment is carried out through the external data terminals 6 and the data terminals 4 of the integrated circuit 1.

FIG. 2 is a block diagram schematically showing another structure of a conventional IC card (memory card). Although only one integrated circuit 1 (one memory circuit 2) is provided in the IC card of FIG. 1, a plurality of integrated circuits (memory circuits) may be formed on the IC card. As an example of such IC cards, FIG. 2 shows an IC card having two integrated circuits. Referring to FIG. 2, two integrated circuits 1a and 1b having two memory circuits 2a and 2b respectively are provided in the package 100 of the IC card. The integrated circuit 1a includes n address terminals 3a and m data terminals 4a while the integrated circuit 1b includes n address terminals 3b and m data terminals 4b, as in the integrated circuit 1 of FIG. 1. Similarly, n external address terminals 5 and m external data terminals 6 are provided in the package 100. Respective address terminals of the integrated circuits 1a and 1b are commonly connected to the corresponding external address terminals 5, and the respective data terminals are commonly connected to the corresponding external data terminals 6.

However, these integrated circuits 1a and 1b are different from the integrated circuit 1 of FIG. 1 in that these integrated circuits 1a and 1b comprise output enable terminals 7a and 7b connected to respective memory circuits 2a and 2b. Namely, two external output enable terminals 8a and 8b are provided in the package 100. One terminal 8a is connected to the output enable terminal 7a of the integrated circuit 1a and the other one 8b is connected to the output enable terminal 7b of the integrated circuit 1b. When the said IC card is inserted into the terminal equipment (not shown) and respective output terminals 5, 6, 8a and 8b are coupled to the interface circuit (not shown) of the terminal equipment, a signal selecting either the integrated circuit 1a or 1b is supplied to the external output enable terminals 8a and 8b from the interface circuit. More specifically, signals having different logic levels are applied to the output enable terminals 7a and 7b of the integrated circuits 1a and 1b and, as a result, the data terminals of one of the integrated circuits 1a and 1b are brought to the output state while the data terminals of the other one of the integrated circuits 1a and 1b are brought to the high impedance state. Namely, in effect, only the data terminals of the selected integrated circuit are connected to the external data terminals 6, and therefore, either one of the integrated circuits can be selected by changing the signals applied to the external output enable terminals 8a and 8b. As described above, in the conventional IC card shown in FIG. 2, the memory capacity can be enlarged without increasing the number of external address terminals 5 and the external data terminals 6.

However, in the IC cards shown in FIGS. 1 and 2, n external address terminals 5 are still necessary for inputting n bit address signals. The number of the external address terminals 5 is, for example, 20 when the memory capacity of the memory circuit 2 of FIG. 1 is 1 Mword. The number of necessary external address terminals 5 increases as the capacity of the memory circuit 2 itself is increased. Preferably, the number of external terminals should be smaller and the size of the external terminal should be large, in order to prevent defects in contact and to facilitate manufacturing and processing. Therefore, when the number of external terminals are increased as described above, the IC card itself becomes large. When the size of the terminal is made small to reduce the size of the card, the processing requires high precision, so that the IC card becomes expensive, and, at the same time, malfunctions such as defective contact are likely to occur.

Meanwhile, FIG. 3 is a block diagram schematically showing a conventional logic large scale integrated circuit (logic LSI) with a memory circuit which is operable in a test mode. Such logic LSI is disclosed in, for example, "DESIGNING DIGITAL CIRCUITS WITH EASILY TESTABLE CONSIDERATION" by S. Funatsu et al., 1978 SEMICONDUCTOR TEST CONFERENCE, DIGEST OF PAPERS, Pages 98 to 102. More specifically, referring to FIG. 3, a test address signal is serially applied to a terminal 110 while a serial clock signal is applied to a terminal 120 in a test environment. A shift register 130 converts the received serial address signal to parallel data to output the same. A switching circuit 140 selects the parallel data to apply the same to address inputs of a memory circuit 150 in the test mode. As a result, address to be tested in the memory circuit 150 is designated to perform testing operation. On the other hand, in a normal mode, an address signal from a logic circuit 160 is selected by the switching circuit 140 to be applied to the memory circuit 150, so that data transfer is performed between the memory circuit 150 and the logic circuit 160. As described above, in the conventional logic LSI having test function, a shift register for converting serial address input into parallel data may be provided.

However, this shift register in the logic LSI shown in FIG. 3 is provided only for the purpose of providing test addresses in the test mode and the technique shown in FIG. 3 suggests nothing about the particular use of the shift register to reduce the number of external terminals in a memory card wherein only sequential accessing is possible.

In addition, according to the shift register shown in FIG. 3, in the test mode, a plurality of shift operations are necessary to set one address, so that speed of accessing of the memory circuit can not be increased.

SUMMARY OF THE INVENTION

Therefore, one object of the present invention is to reduce the number of terminals on a memory card.

Another object of the present invention is to provide a compact integrated circuit card which can be easily manufactured.

A further object of the present invention is to provide a memory card having improved reliability as a result of the reduced number of terminals.

A still further object of the present invention is to provided a semiconductor memory device capable of operating memory and increasing data transfer rate.

Briefly stated, the semiconductor memory device in accordance with the present invention comprises: a memory circuit for storing data, having a plurality of address terminals for receiving in parallel address data for reading data and at least one data terminal for outputting data; means for temporarily disabling the memory circuits, the data terminal serially receiving external address data only when the memory circuit is in the disabled state; and a shift register having a serial input terminal connected to the data terminal which receives the address data, and converting the address data received in series to parallel data to supply the same to the plurality of address terminals of the memory circuit.

According to another aspect of the present invention, the semiconductor memory device comprises: a plurality of memory circuits for storing data, each of these memory circuits having a plurality of address terminals receiving in parallel address data for reading data and at least one data terminal for outputting data; at least one external data terminal commonly connected to the respective data terminals of the plurality of memory circuits, and means for temporarily disabling each of the plurality of memory circuits, the external data terminal serially receiving external address data only when all of the plurality of memory circuits are in the disabled state to supply the same commonly to the data terminals of the respective memory circuits; a plurality of shift registers provided in one to one correspondence with the memory circuits, each of the shift registers having a serial input terminal connected to the data terminal which is connected to the external data terminal which receives the address data, and converting the serially received address data to parallel data to supply the same to the plurality of address terminals of the corresponding memory circuit.

According to a further aspect of the present invention, the semiconductor memory device comprises: a memory circuit for storing data, having a plurality of address terminals receiving in parallel address data for reading/writing data and at least one data terminal for inputting/outputting data; a first shift register serially receiving external address data for data reading to convert the same to parallel data; and a second shift register serially receiving external address data for data writing to convert the same to parallel data; wherein the serial address data is a binary digit string in accordance with an exhaustive random sequence; the semiconductor memory device further comprises a selector alternately selecting either the address data supplied from the first shift register or the address data from the second shift register to supply the same to the address terminals of the memory circuit.

According to a still further aspect of the present invention, the semiconductor memory device comprises: a plurality of memory circuits for storing data, each of the memory circuits having a plurality of address terminals for receiving in parallel address data for reading data and at least one data terminal for outputting data; a plurality of comparing circuits provided in one to one correspondence with the memory circuits, a plurality of identification code generating circuits provided in one to one correspondence with the memory circuits for generating specific identification code for designating respective memory circuits to be supplied to one input of the comparing circuit; and a plurality of shift registers provided in one to one correspondence with the memory circuits commonly receiving external serial address data; wherein each of the shift registers converts the received serial address data to parallel data to supply the address data for reading data to the address terminals of the corresponding memory circuit and to supply the address data identifying the memory circuit to another input of the comparing circuit; each of the comparing circuits compares the identification code generated from the corresponding identification code generating circuit with the address data outputted from the corresponding shift register and, when the both satisfy a particular condition, generates a signal and supplies the same to the memory circuit, which signal prohibits the operation of the corresponding memory circuit.

According to a still further aspect of the present invention, the integrated circuit card comprises: a package having a plurality of external terminals; an integrated circuit formed on the package; a memory device having a plurality of address nodes and at least one data terminal; a shift register having a clock terminal, a serial input terminal and parallel data output nodes corresponding to stages of the shift register; the memory device and the shift register being formed on the integrated circuit; the parallel data output nodes of the shift register being interconnected on the integrated circuit with the address nodes of the memory device; and the serial input terminal of the shift register and the at least one data terminal of the memory device being connected to the corresponding external terminals of the package.

According to a still further aspect of the present invention, for the semiconductor memory device having a plurality of address terminals for receiving from parallel address lines parallel address data for reading data and a plurality of data terminals for outputting the data on parallel data lines, an operating method comprises the steps of: temporarily disabling the memory device; applying to only one of the data lines serial address data corresponding to a memory location in the memory device; receiving the serial address data on the one data line; converting the serial address data to parallel address data; enabling the memory device; and applying the parallel address data to the address terminals of the memory device.

According to a still further aspect of the present invention, for the semiconductor memory device having a plurality of address terminals for receiving in parallel address data for reading data and a plurality of data terminals for outputting the data, an addressing method comprises the steps of: generating first serial exhaustive random sequence (ERS) data; shifting the first serial ERS data to provide second serial ERS data; converting the first and second serial ERS data to first and second parallel ERS data; and addressing the memory device alternately with the first and second parallel ERS data.

An advantage of the present invention is that the number of external terminals can be reduced in a semiconductor memory device, as a shift register is provided for setting addresses of the memory circuit.

Another advantage of the present invention is that the number of external terminals can be reduced in a semiconductor memory device, as a shift register is provided for setting addresses of the memory circuit with the data terminals of the memory circuit also serving as the serial input terminal of the shift register.

A further advantage of the present invention is that the data stored in the memory circuit can be transferred at high speed by providing a first shift register for storing address data for reading and a second shift register for storing address data for writing, employing address data in accordance with the exhaustive random sequence for respective shift registers and by selecting outputs of the shift registers alternately to apply the same to the address terminals of the memory circuit.

A still further advantage of the present invention is that the memory capacity can be enlarged without causing malfunctions by providing a plurality of memory circuits and identification code generating circuits identifying respective memory circuits, and by comparing the address data supplied from the shift register with the identification code to prohibit the operation of the non-selected memory circuits.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a timing chart for explaining operation of the embodiment shown in FIG. 4;

FIG. 8 is a table illustrating the principle of the exhaustive random sequence;

FIG. 12 is a timing chart for explaining operation of the embodiment shown in FIG. 10.

DESCRIPTION OF THE PREFERRED EMBODIMENTS

Figure 1:
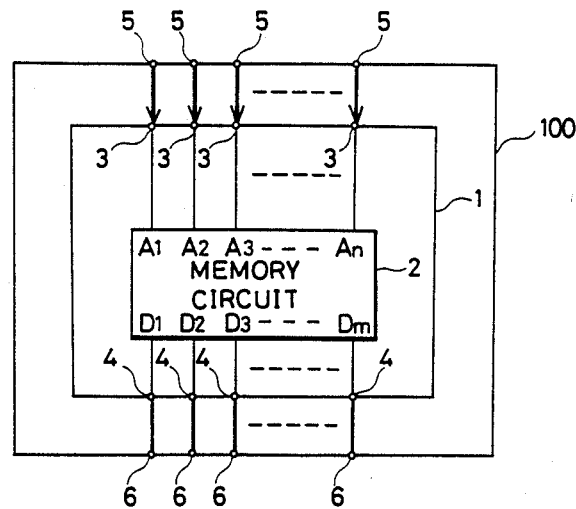
FIG. 1 is a block diagram schematically showing the structure of a conventional IC card.
Figure 4:
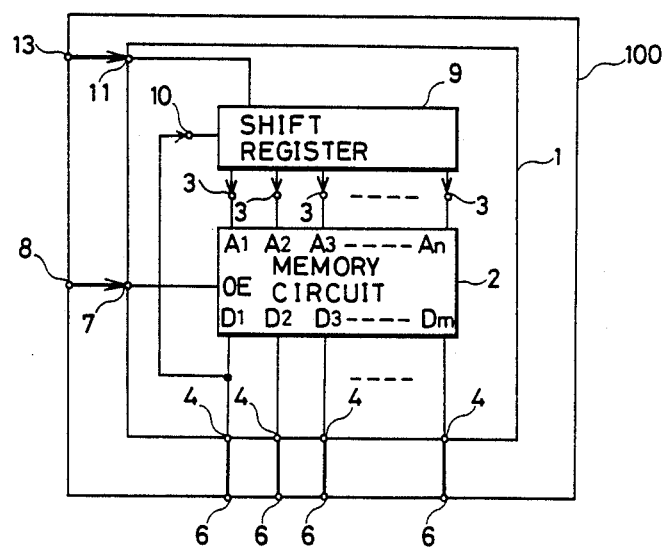
FIG. 4 is a block diagram showing an IC card in accordance with one embodiment of the present invention.

FIG. 4 is a schematic block diagram showing an IC card in accordance with one embodiment of the present invention. The IC card shown in FIG. 4 is the same as that shown in FIG. 1 except the following points. Namely, the external address terminals 5 of FIG. 1 are omitted and, alternatively, a shift register 9 is provided in the integrated circuit 1. The shift register 9 comprises a serial input terminal 10 and a serial shift clock terminal 11. The integrated circuit 1 comprises an output enable terminal 7 connected to the memory circuit 2 while the package 100 comprises an external output enable terminal 8 and an external serial shift clock terminal 13. The former terminal is connected to the output enable terminal 7 of the integrated circuit 1 while the latter terminal is connected to the serial shift clock terminal 11. In addition, the serial input terminal 10 of the shift register 9 is connected to one of m data terminals 4. An n-bit output of the shift register 9 is supplied to n address terminals (nodes) 3 of the memory circuit 2.

Figure 5:
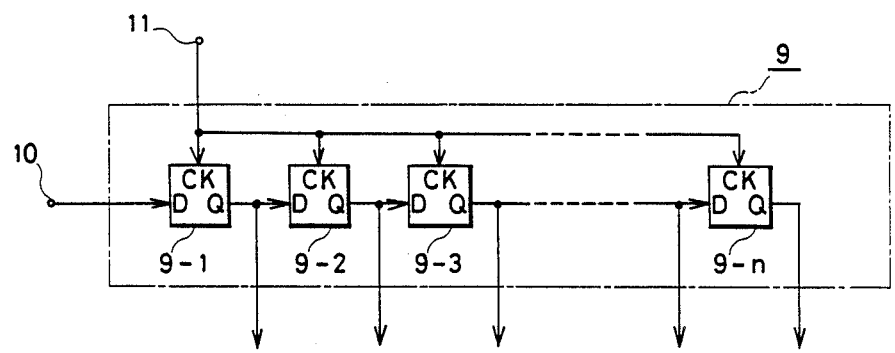
FIG. 5 is a block diagram showing in detail the structure of the shift register shown in FIG. 4.

FIG. 5 is a block diagram showing in detail the structure of the shift register 9 of FIG. 4. As shown in FIG. 5, the shift register 9 comprises n stages of DQ flip flops 9-1, 9-2, ..., 9-n connected in series. More specifically, the serial input terminal 10 is connected to a D input of the DQ flipflop of the first stage, and the serial shift clock terminal 11 is connected in parallel to each of the n stages of flip flops. A Q output of each flip flop is applied to the D input of the flip flop in the succeeding stage, and at the same time, outputted as an address signal to be applied to the corresponding address terminal 3 of the memory circuit 2.

FIG. 6 is a timing chart for explaining operation of the embodiment shown in FIG. 4. Operating of the IC card according to the first embodiment of the present invention will be described with reference to FIGS. 4 and 6.

In the IC card of the embodiment shown in FIG. 4, the memory circuit 2 comprises an output enable terminal 7. In operation, the memory circuit 2 is selectively brought to the enabled state or disabled state dependent on a signal (FIG. 6(a)) supplied from an external interface circuit (not shown) through an external output enable terminal 8 to the output enable terminal 7.

More specifically, when the memory circuit 2 is disabled in accordance with the signal (a) at a low level applied from the interface circuit to the external output enable terminal 8, that is, when the data outputs $D_l$ to $D_m$ are in the high impedance state, one of the external data terminals 6 (for example, the one corresponding to the output data bit $D_l$) is used as an external serial input terminal. Namely, in synchronization with a clock signal (FIG. 6(b)) supplied from the external interface circuit through the external shift clock terminal, the address information is inputted bit by bit to the shift register 9 (FIG. 6(c)) through the said one external data terminal 6 (corresponding to $D_l$) to set the desired address in the shift register 9. The address information supplied bit by bit in series is converted into parallel address signal of n bits by means of the n stages of shift register 9 such as shown in FIG. 4 to be applied to the memory circuit 2.

When the memory circuit 2 is enabled in accordance with the signal (a) at a high level applied to the external output enable terminal 8, the exchange of m bits data $D_l$ to $D_m$ between the memory circuit 2 and all of the external data terminal 6 (for example, reading of data $D_l$ to $D_m$) is carried out based on the address set in the shift register 9 as shown in FIGS. 6(c) and (d). Thereafter, when the memory circuit 2 is disabled again, the address information is inputted through the one external data terminal 6, whereby the next address is set in the shift register 9.

As described above, in the embodiment shown in FIG. 4, the address information is inputted into the shift register bit by bit in series through one of the data terminals, thereby reducing the number of external terminals of the IC card.

Figure 2:
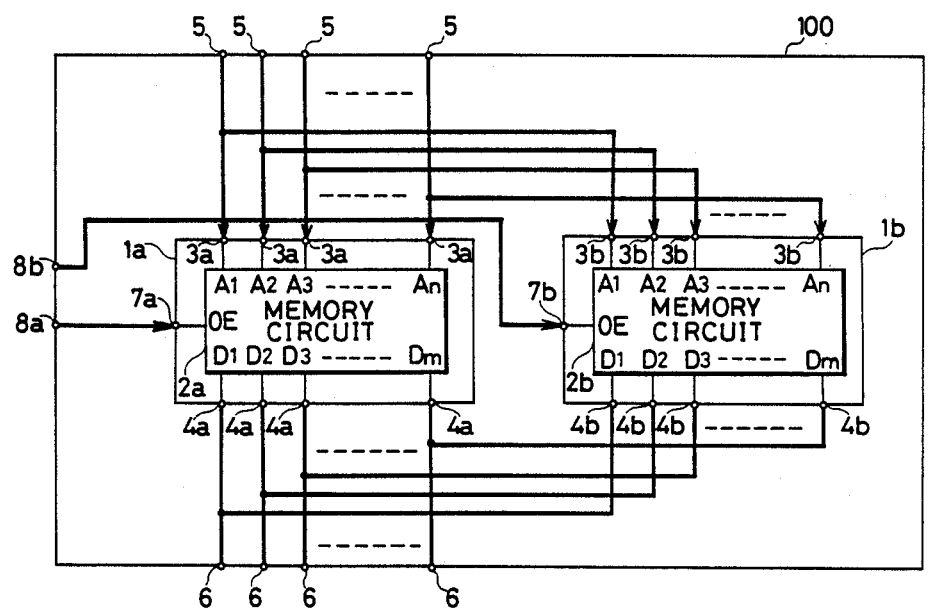
FIG. 2 is a block diagram schematically showing another structure of the conventional IC card.
Figure 3:
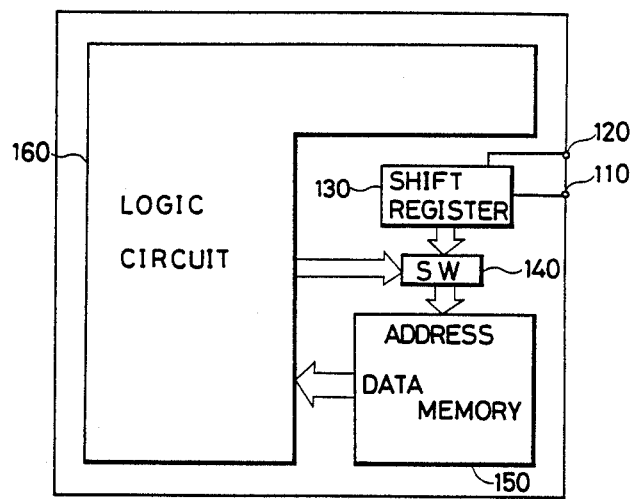
FIG. 3 is a schematic block diagram showing the structure of a conventional logic LSI with a memory circuit.
Figure 7:
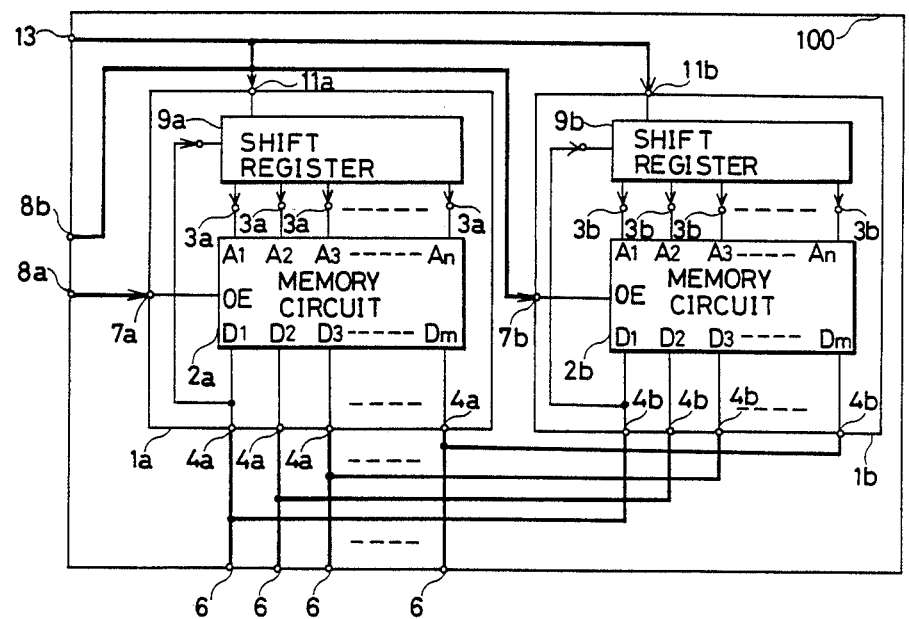
FIG. 7 is a block diagram showing a modification of the embodiment shown in FIG. 4.

FIG. 7 is a schematic block diagram showing a modification of the embodiment shown in FIG. 4, in which the present invention is applied to an IC card comprising a plurality of integrated circuits (memory circuits) (two in this example) in a single package, such as described with reference to FIG. 2. In the IC card shown in FIG. 7, one of the integrated (memory) circuits is selectively brought to the enabled state and the other one is brought to the disabled state in accordance with signals applied to the external output enable terminals 8a and 8b, as in the prior art shown in FIG. 2. In the example of FIG. 7, further a period is provided during the switching of the states in which both circuits are disabled. During that period, one of the external data terminals is utilized as an external serial input terminal, and the address information is inputted in series to the shift registers 9a and 9b, respectively. Therefore, one of the memory circuits 2a and 2b which is enabled is accessed by the address set in the corresponding shift register.

Meanwhile, the IC cards shown in FIGS. 4 to 7 have a disadvantage that it requires much time to input the address information bit by bit in series to the shift register. In order to assure fast address setting, the shift register should be used in the following manner.

FIG. 8 is a table illustrating the exhaustive random sequence used for setting addresses at high speed. In FIG. 8, a binary digit string "0001001101011110000" shows an example of quaternary exhaustive random sequences. The principle of the exhaustive random sequences is described in, for example, the publication entitled "BINARY SEQUENCES" by G. Hoffmann de Visme, published in 1971.

Now, the n valued exhaustive random sequence means a binary digit string in which an arbitrary binary value represented by continuous n bits is different from any other binary value represented by an arbitrary continuous n bits in the binary digit string. The n bit binary values cover all values from 0 to $2^n - 1$. In the example of the quaternary exhaustive random sequence shown in FIG. 8, it can be understood that the respective continuous 4 bits correspond to the values 0 to 15 ($2^4 - 1$), respectively, as shown by the decimal representation on the right side.

If the above described exhaustive random sequence is not used, n times of shift operations are necessary for setting one address (n bits) in the shift register. If the exhaustive random sequence is serially shifted in the shift register, the address value held by the shift register can be updated by one shift operation. In addition, the address from 0 to $2^n - 1$ can be set. In the example shown in FIG. 8, the setting of the address 0, the address 8, the address 12 . . . can be carried out by only one shift operation, respectively, by shifting in the quaternary exhaustive random sequence in the right direction to the shift register. Therefore, by using the exhaustive random sequence, the address can be set in the shift register at high speed even in the structures shown in FIGS. 4 to 7.

However, in the example of FIG. 8, four shift operations are needed for setting the address 12, the address 8, and the address 0, respectively, in the reverse order.

Figure 9:
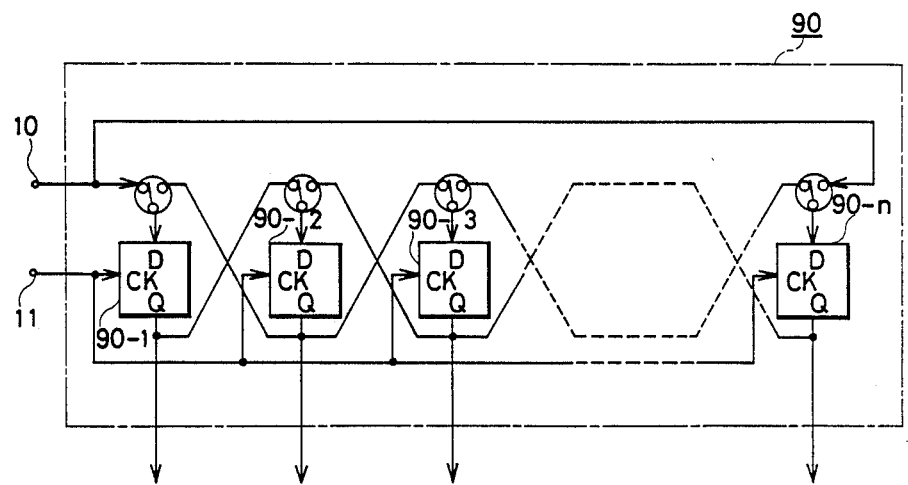
FIG. 9 is a block diagram showing in detail the structure of a bidirectional shift register.

In order to solve the problem, a bidirectional shift register capable of shifting both in the left and right directions should be used as the shift register for address setting. FIG. 9 is a block diagram showing the structure of the bidirectional shift register 90. Referring to FIG. 9, the D input of each of the flip flops 90-1, 90-2, . . . , 90-n is adapted to selectively receive a shift input to the left direction or a shift input to the right direction in accordance with a switching of a switching element. When the bidirectional shift register 90 such as shown in FIG. 9 is used, the bidirectional shift in of the exhaustive random sequence becomes possible, and the address setting in the reverse order can be carried out by one shift operation.

Figure 10:
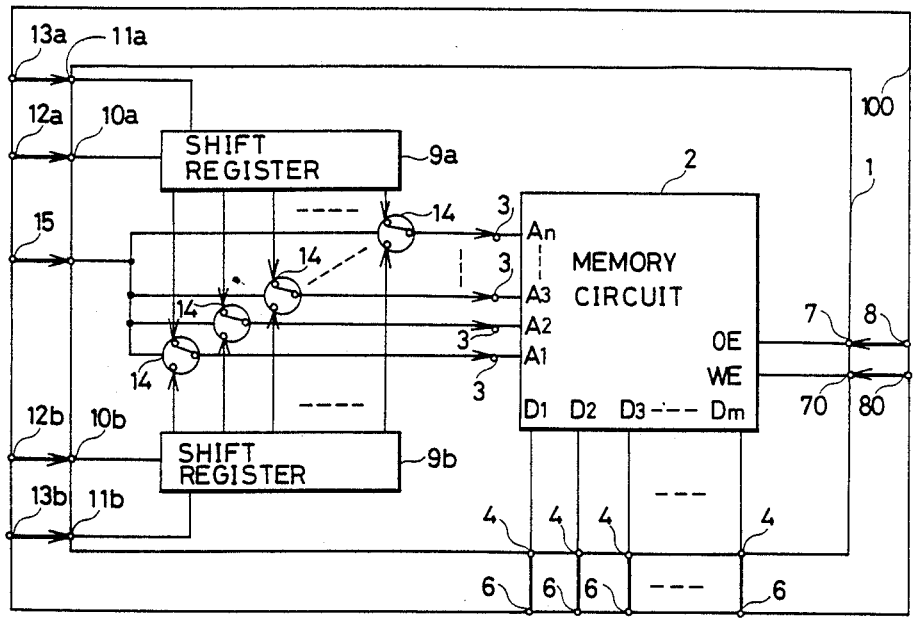
FIG. 10 is a block diagram showing an IC card in accordance with another embodiment of the present invention.

FIG. 10 is a block diagram showing an IC card in accordance with another embodiment of the present invention, in which high speed data transfer is realized by employing the exhaustive random sequence.

The embodiment shown in FIG. 10 is used, for example, in an environment wherein data stored in a memory circuit in an IC card is to be transferred from one memory location to another memory location in order to increase a free area. Generally, in such a case, the data stored in one memory location in the IC card is once transferred to an interface circuit in an external terminal equipment to be temporarily stored therein. Then, such data is transferred to another memory location in the IC card from the terminal equipment to be written therein.

According to the embodiment shown in FIG. 10, a high speed sequential data transfer from one memory location to another memory location can be realized.

Referring to FIG. 10, there are two shift registers 9a and 9b comprising serial input terminals 10a and 10b and serial shift clock terminals 11a and 11b, respectively. The address information of the exhaustive random sequence such as shown in FIG. 8 is inputted to the serial input terminals 10a and 10b through external serial input terminals 12a and 12b, respectively, from an external interface circuit (not shown). Clock signals are inputted to serial shift clock terminals 11a and 11b through external serial shift clock terminals 13a and 13b, respectively, from the interface circuit. A selector circuit 14 selects either an n bit address signal outputted from the shift register 9a or an n bit address signal outputted from the shift register 9b to apply the same to the address terminals 3 of the memory circuit 2. The switching of the selector circuit 14 is controlled by a control signal applied from the interface circuit through an external terminal 15. In addition, a write enable signal is applied to the memory circuit 2 through an external write enable terminal 80 and a write enable terminal 70.

Figure 11A:
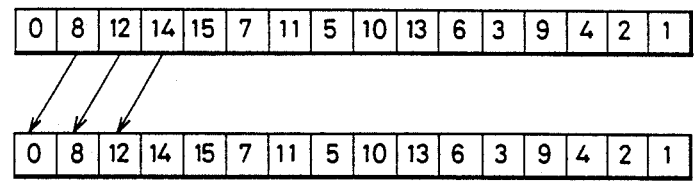
FIG. 11A and 11B illustrate the operation of the IC card shown in FIG. 10.
Figure 11B:
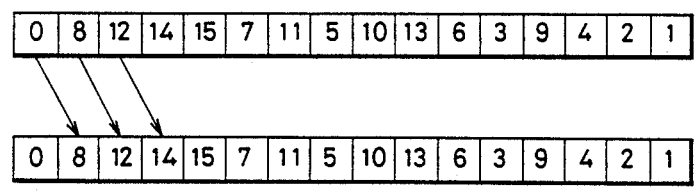

FIGS. 11A and 11B illustrate the high speed data transfer operation realized by the circuit structure shown in FIG. 10.

In FIG. 10, the shift register 9a is for storing reading addresses of the memory circuit 2 while the shift register 9b is for storing the writing addresses of the memory circuit 2. FIG. 11A shows a case in which the data of the address 8, the data of the address 12, and the data of the address 14 obtained in accordance with the exhaustive random sequence shown in FIG. 8 are transferred to the addresses 0, 8 and 12, respectively, with the upper stage showing the reading address successively set in the shift register 9a and the lower stage showing the reading address successively set in the shift register 9b.

FIG. 12 is a timing chart for explaining operation of the embodiment shown in FIG. 10. Operation of the embodiment shown in FIG. 10 will be described with reference to FIGS. 10 and 12.

First, data "0001" (FIG. 12(d)) is shifted in to the shift register 9a in series in synchronization with a shift clock (FIG. 12(c)) so that a reading start address (address 8) is set in the shift register 9a (FIG. 12(a)). At the same time, data "0000" (FIG. 12(e)) is shifted in to the shift register 9b in series in synchronization with the shift clock (c) so that a writing start address (address 0) is set in the shift register 9b (Fib. 12(b)). Then, the address signal held in the shift register 9a is selected by the selector circuit 14 constituted by a plurality of semiconductor switching elements to be applied to the address terminals 3 of the memory circuit 2. Then, data (FIG. 12(g)) at the read address (address 8) set in the shift register 9a is read out from the memory circuit 2 in response to the output enable signal (FIG. 12(f)) applied through the external output enable terminal 8 and the output enable terminal 7, to be transferred to the external interface circuit contained in the terminal equipment through the data terminals 4 and the external data terminals 6 for temporary storage of the data. Then, the address signal held in the shift register 9b is selected by the selector circuit 14 to be applied to the address terminals 3 of the memory circuit 2. In response to the write enable signal (FIG. 12(h)) applied through the external write enable terminal 80 and the write enable terminal 70, the data temporarily stored in the interface circuit is written in the writing address (address 0) set by the shift register 9b in the memory circuit 2.

Then, the binary digit strings of the exhaustive random sequence into the shift registers 9a and 9b are shifted by a single bit, respectively ((d) and (e)). As a result, the address 12 corresponding to data "0011" is set in the shift register 9a as shown in FIG. 12(a) while the address 8 corresponding to data "0001" is set in the shift register 9a as shown in FIG. 12(b). Then, data (g) at the reading address 12 is read out from the memory circuit 2 in response to the output enable signal (f) as described above to be temporarily stored in the interface circuit. Then, in response to the write enable signal (h), the data temporarily stored in the interface circuit is written in the writing address 8 in the memory circuit 2.

Then, the binary digit strings into the shift registers 9a and 9b are further shifted by a single bit, respectively ((d) and (e)). As a result, the address 14 corresponding to data "0111" is set in the shift register 9a as shown in FIG. 12(a) while the address 12 corresponding to data "0011" is set in the shift register 9b as shown in FIG. 12(b). Then, data (g) at the reading address 14 is read out from the memory circuit 2 in response to the output enable signal (f) as described above to be temporarily stored in the interface circuit. Then, in response to the write enable signal (h), the data temporarily stored in the interface circuit is written in the writing address 12 in the memory circuit 2.

As described in the foregoing, a reading start address (address 8) is set in the shift register 9a; a writing start address (address 0) is set in the shift register 9b; the shifting operation of each of the shift registers is carried out using the binary digit string of the exhaustive random sequence; the address signal held in the shift register is alternately selected in repetition by the selector circuit 14 to supply the same to the address terminal 3 of the memory circuit 2. Through the above described operation, the data transfer operation constituted by a series of operations such as data reading from the memory circuit 2, temporary storage of the data in the external interface circuit, and writing of the data to another address of the memory circuit 2 can be carried out at high speed. As is apparent from FIG. 11A, if there is only one shift register provided, the data transfer operation including the data reading from the address 8, the data writing to the address 0, the data reading from the address 12, the data writing to the address 8, the data reading from the address 14, and the data writing to the address 12 requires four shift operations for respective addresses. In that case, the use of the exhaustive random sequence has no advantage. In other words, the use of the exhaustive random sequence in the circuit structure having two shift registers, as in FIG. 10, is quite effective in realizing high speed data transfer.

FIG. 11B illustrates the data transfer operation constituted by a series of operations including the data reading from the address 12, the data writing to the address 14, the data reading from the address 8, the data writing to the address 12, the data reading from the address 0 and the data writing to the address 8. In order to perform high speed address setting in such a reverse order, a bidirectional shift register 90 shown in FIG. 9 should be used as the shift register for address setting.

Figure 13:
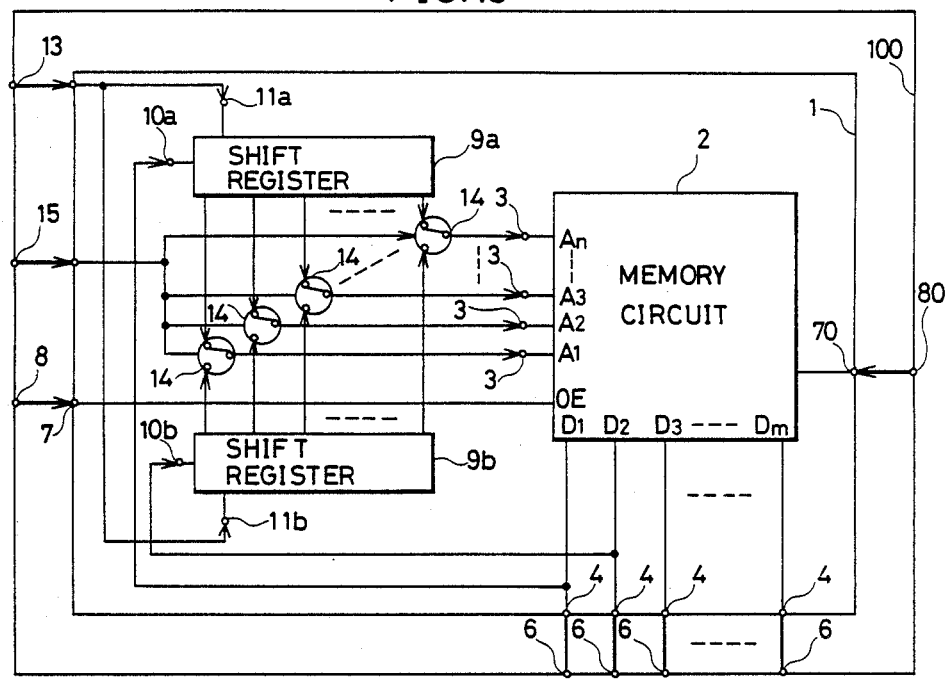
FIG. 13 is a block diagram showing a first modification of the IC card shown in FIG. 10.

FIG. 13 is a block diagram showing a modification of the IC card shown in FIG. 10. The IC card shown in FIG. 13 is the same as that shown in FIG. 10 except the following points. Namely, in the normal data transfer, the reading address and the writing address are updated simultaneously. Therefore, the serial shift clock terminals 11a and 11b of the shift registers 9a and 9b can be connected together to reduce one external serial shift clock terminal 13. By connecting the serial input terminal of each of the shift registers 9a and 9b to any one of the data terminals 4 of the memory circuit 2 and by using the data terminal 4 as the external serial input terminal when the memory circuit 2 is disabled by the signal inputted from the external output enable terminal 8, the external serial input terminal 12a and 12b can be omitted, whereby the number of external terminals of the IC card can be reduced.

Figure 14:
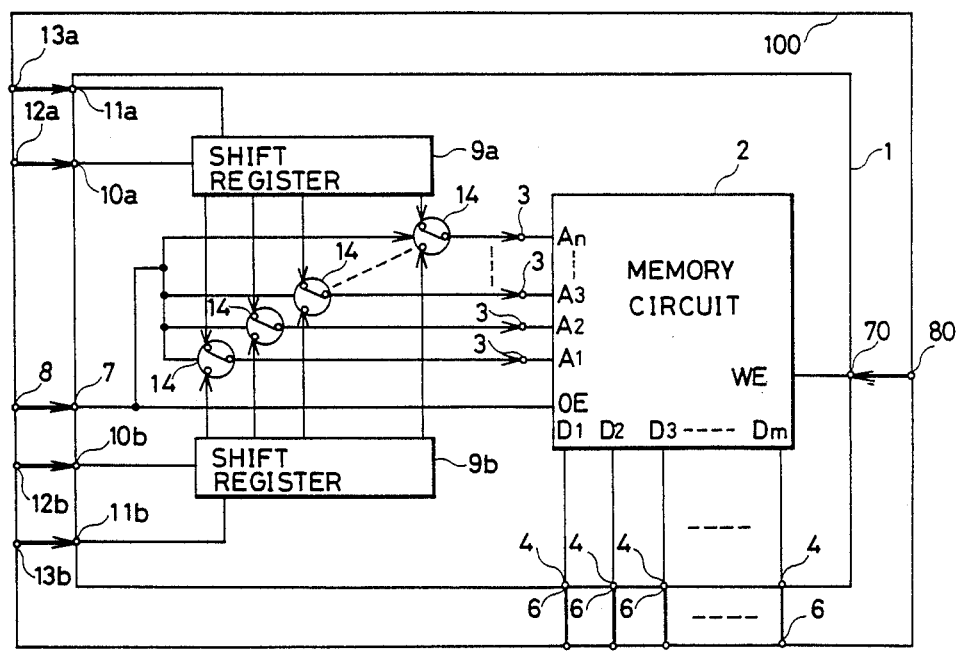
FIG. 14 is a block diagram showing a second modification of the IC card shown in FIG. 10.

FIG. 14 is a block diagram showing another modification of the IC card shown in FIG. 10. The IC card shown in FIG. 14 is the same as that of FIG. 10 except the following points. Namely, the IC card of FIG. 14 employs a signal applied to the external output enable terminal 8 as a control signal for switching the selector circuit 14. Namely, the signal applied to the external output enable terminal 8 is a logic signal which is switched to set the data terminals 4 at the output state in reading the memory circuit 2 and to set the terminals at the high impedance state in writing. Therefore, the switching of the selector circuit 14 can be controlled with the timing corresponding to the reading and writing of the memory circuit 2 by utilizing the signal. Consequently, the external terminal 15 of FIG. 10 can be omitted, whereby the number of external terminals of the IC card can be reduced.

Figure 15:
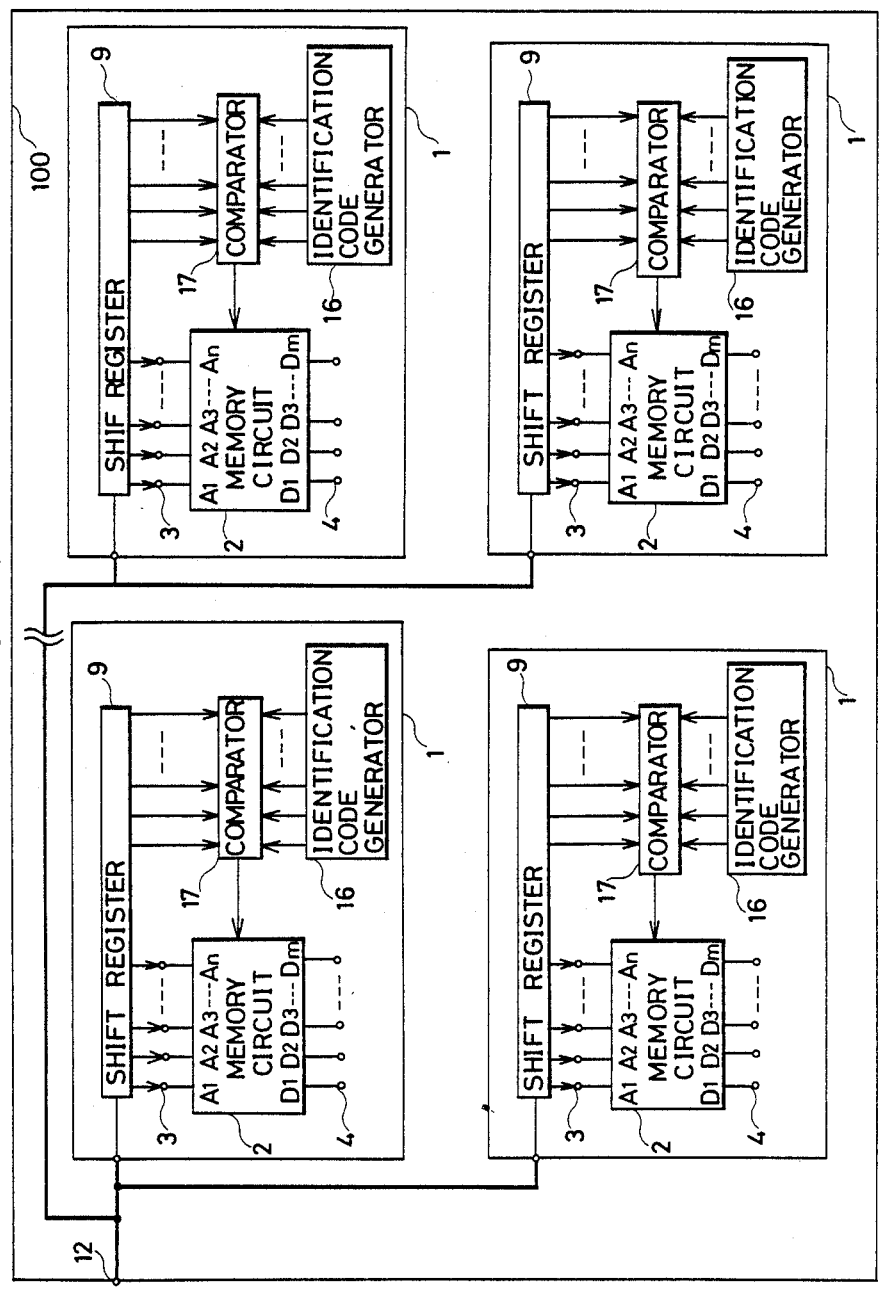
FIG. 15 is a block diagram showing an IC card in accordance with a further embodiment of the present invention.

FIG. 15 is a block diagram showing an IC card in accordance with another embodiment of the present invention. In FIG. 15, a plurality of integrated circuits 1 are provided in the package 100 of the IC card to enlarge the memory capacity of the IC card. In operation, the selection of any one of the plurality of integrated circuits 1 can be detected by the selected integrated circuit 1 itself. Referring to FIG. 15, each of the plurality (for example $2^k$) of integrated circuits 1 has the same structure, and the number of stages of the shift register 9 in each integrated circuit 1 is larger than the number n of the address terminals of the memory circuit 2. In order to identify the $2^k$ integrated circuits 1, an identification code of k bits is necessary. Let us assume that an identification code generating circuit 16 generates, in each integrated circuit 1, a k-bit identification code identifying respective integrated circuit 1. The identification code can be written by means of laser to be stored. The shift register 9 in each integrated circuit 1 has (n+k) stages, which is the sum of the bit number n of the address of the memory circuit 2 and the number k of bits of the identification code. By shifting in the (n+k) valued exhaustive random sequence to the (n+k) stages of the shift register 9, all addresses from 0 to $2^{n+k}-1$ can be set as described with reference to FIG. 8. The higher order n bits of the shift register are applied to the address terminals 3 of the memory circuit 2 as the address signal, while the lower k bits are applied to the comparator 17 as the identification address signal. In each integrated circuit 1, the comparator 17 compares the k bit identification code generated from the identification code generating circuit 16 with the k bit identification address signal from the shift register 9. If a specified condition is not satisfied, for example, when the both are not coincide with each other, the comparator supplies an operation prohibit signal to the memory circuit 2, thereby prohibiting the operation of the memory circuit 2.

Now, if different identification codes are allotted to respective integrated circuits, only one integrated circuit operates at one time when (n+k) valued exhaustive random sequence is commonly shifted in to the shift registers of all integrated circuits through the external serial input terminal 12 to set the same (n+k) bit address in respective shift registers. Therefore, the memory capacity of the IC card can be enlarged without causing malfunctions. Since the address information for identifying integrated circuits is also set in the shift register, there is no need of providing special external terminal for identification, whereby the increase of the number of the external terminal can be suppressed.

The data terminals 4 of the memory circuit 2 of each integrated circuit are commonly connected to the external data output terminal. However, it is not shown in the figure for the purpose of simplification.

Figure 16:
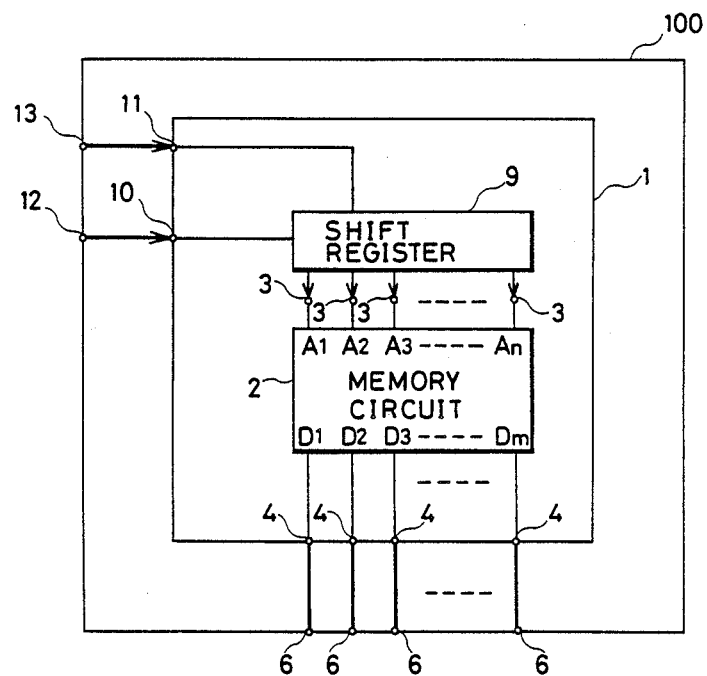
FIG. 16 is a block diagram showing an IC card in accordance with a still further embodiment of the present invention.

FIG. 16 is a schematic block diagram showing an IC card in accordance with a further embodiment of the present invention. The IC card shown in FIG. 16 is the same as that shown in FIG. 4 except the following points. Namely, the serial input terminal 10 of the shift register 9 is connected to an external serial input terminal 12 provided in the package 100 instead of the data terminal 4. In addition, the memory circuit 2 does not include the output enable terminal 7. According to the embodiment shown in FIG. 16, the shift register 9 receives the address information bit by bit in series and converts the same into the parallel address signal, thereby reducing the number of external terminals of the IC card.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising memory means for storing data, having
    a plurality of address terminals for receiving in parallel address information for reading said data, and
    at least one data terminal for outputting said data;
    means for temporarily disabling said memory means,
    said at least one data terminal serially receiving the address information from an external source only during a period when said memory means is in the disabled state; and
    shift register means having a serial input terminal connected to said one of said at least one data terminal for converting said address information received in series to parallel address information to supply the same to the plurality of address terminals of said memory means.

2. A semiconductor memory device according to claim 1, wherein
    said shift register means comprises a clock terminal for externally receiving a shift clock signal.

3. A semiconductor memory device according to claim 2, wherein
    said address information serially received is a binary digit string in accordance with an exhaustive random sequence.

4. A semiconductor memory device according to claim 3, wherein
said shift register means is a bidirectional shift register.

5. A semiconductor memory device comprising:
a plurality of memory means for storing data, each having
a plurality of address terminals receiving in parallel address information for reading said data, and
at least one data terminal for outputting said data;
at least one external data terminal connected together to the data terminals of said plurality of memory means;
means for temporarily disabling each of said plurality of memory means, said at least one external data terminal receiving in series the address information from an external source only during a period when all of said plurality of memory means are in the disabled state to supply the same commonly to the data terminals of said memory means and;
a plurality of shift register means provided in one to one correspondence with said memory means, each of said shift register means having a serial input terminal connected to the data terminal which is connected to said at least one external data terminal, said shift register means converting said serially received address information to parallel address information to supply the same to the plurality of address terminals of the corresponding memory means.

6. A semiconductor memory device according to claim 5, wherein
said plurality of shift register means comprise clock terminals for externally receiving shift clock signals in common.

7. A semiconductor memory device according to claim 5, wherein
said address information serially received is a binary digit string in accordance with an exhaustive random sequence.

8. A semiconductive memory device according to claim 7, wherein
each of said plurality of shift register means is a bidirectional shift register.

9. A semiconductor memory device comprising:
memory means for storing data, having
a plurality of address terminals for receiving in parallel address information for reading/writing said data, and
at least one data terminal for inputting and outputting said data;
a first shift register means externally receiving in series address information for data reading to convert said series address information to first parallel address information;
a second shift register means externally receiving in series address information for data writing to convert said series address information to second parallel address information,
said serial address information being a binary digit string in accordance with an n valued exhaustive random sequence wherein an arbitrary binary value represented by continuous n bits is different from any other binary value represented by an arbitrary continuous n bits in the binary digit string; and
selector means alternatively selecting either the address information supplied from said first shift register means or the address information from said second shift register means to supply the same to the address terminals of said memory means.

10. A semiconductor memory device according to claim 9, wherein
said first and second shift register means include separate clock terminals for receiving external shift clock signals.

11. A semiconductor memory device according to claim 10, wherein
each of said first and second shift register means is a bidirectional shift register.

12. A semiconductor memory device according to claim 10, further comprising an external terminal for receiving an external signal controlling switching operation of said selector means.

13. A semiconductor memory device according to claim 10, further comprising
means for temporarily disabling said memory means.

14. A semiconductor memory device according to claim 13, wherein
said memory means has a plurality of data terminals,
one of said plurality of data terminals receives in series said address information for data reading from an external source and another one of said plurality of data terminals receives in series said address information for data writing from an external source only during a period when said memory means is at the disabled state;
said first shift register means includes a serial input terminal connected to said one of said plurality of data terminals; and
said second shift register means includes a serial input terminal connected to said another one of said plurality of data terminals.

15. A semiconductor memory device according to claim 13, wherein
said selector means receives a signal for controlling switching operation of said selector means from said means for disabling said memory means.

16. A semiconductor memory device according to claim 9, further comprising
an external clock terminal commonly connected to the clock terminals of said first and second shift register means for receiving external shift clock signals.

17. A semiconductor memory device comprising:
a plurality of memory means for storing data, each having
a plurality of address terminals receiving in parallel address information for reading said data, and
at least one data terminal for outputting said data;
a plurality of comparing means provided in one to one correspondence with said memory means;
a plurality of identification code generating means provided in one to one correspondence with said memory means for generating a specified identification code identifying each of the memory means and supplying the same to one input of said comparing means; and
a plurality of shift register means provided in one to one correspondence with said memory means for receiving in common external address information in series, each of said shift register means converting said received serial address information to parallel address information to supply address information for data reading to the address terminals of the corresponding memory means and to supply address information identifying said corresponding memory means to another input of said comparing means;

wherein each of said comparing means compares the identification code generated from the corresponding identification code generating means with the address information outputted from said corresponding shift register and generates a signal prohibiting the operation of the corresponding memory means to the memory means when a predetermined condition is satisfied.

18. A semiconductor memory device according to claim 17, wherein
each of said shift register means supplies in parallel address information, whose bit number is equal to a sum of a bit number of said address information for data reading and a bit number of said address information for identifying the memory means.

19. A semiconductor memory device according to claim 18, wherein
said external address information is a binary digit string in accordance with an exhaustive random sequence.

20. A semiconductor memory device according to claim 19, wherein
each of said shift register means is a bidirectional shift register.

21. An integrated circuit card comprising:
external terminals, an integrated circuit,
a memory device having a plurality of address nodes and at least one data terminal,
a shift register having a clock terminal, a serial input terminal and parallel data output nodes corresponding to stages of said shift register,
said memory device and said shift register being formed on said integrated circuit,
said parallel data output nodes of said shift register being interconnected on said integrated circuit with said address nodes of said memory device, and
said serial input terminal of said shift register and said at least one data terminal of said memory device being connected to the corresponding external terminals.

22. An integrated circuit card according to claim 21, wherein
said external terminals are connected to external circuitry, said external circuitry including means for supplying to said serial input terminal of said shift register serial addressing information for addressing said memory device.

23. For a semiconductor memory device having a plurality of address terminals for receiving from parallel address lines parallel address information for reading data and a plurality of data terminals for outputting said data on parallel data lines, an operating method, comprising the steps of,
temporarily disabling said memory device,
applying to only one of said data lines serial address information corresponding to a memory location in said memory device,
receiving said serial address information on said one data line,
converting said serial address information to parallel address information,
enabling said memory device, and
applying said parallel address information to said address terminals of said memory device.

24. For a semiconductor memory device having a plurality of address terminals for receiving in parallel address information for reading data and a plurality of data terminals for outputting said data, an addressing method, comprising the steps of,
generating first serial exhaustive random sequence (ERS) data,
shifting said first serial ERS data to provide second serial ERS data,
converting said first and second serial ERS data to first and second parallel ERS data, and
addressing said memory device alternately with said first and second parallel ERS data.

25. A method according to claim 24, wherein shifting of said first and second serial ERS data is controlled in common.

26. A method according to claim 24, wherein alternate addressing of said memory device with said first and second parallel ERS data is controlled in synchronization with disabling of said memory device.

27. A method according to claim 24, wherein shifting of each of said first and second serial ERS data is made in a bidirectional manner.

* * * * *

UNITED STATES PATENT AND TRADEMARK OFFICE
CERTIFICATE OF CORRECTION

PATENT NO. : 4,969,126
DATED : November 6, 1990
INVENTOR(S) : Hideshi MAENO

It is certified that error appears in the above-identified patent and that said Letters Patent is hereby corrected as shown below:

ON TITLE PAGE:

Under [30] Foreign Application Priority Data, please correct as follows:

[Apr.] Jan. 14, 1988 .................... 63-6145

Signed and Sealed this

Twenty-eighth Day of April, 1992

*Attest:*

HARRY F. MANBECK, JR.

*Attesting Officer*  *Commissioner of Patents and Trademarks*